(12) United States Patent
Saito et al.

(10) Patent No.: US 8,553,118 B2
(45) Date of Patent: Oct. 8, 2013

(54) SOLID-STATE IMAGING APPARATUS

(75) Inventors: Kazuhiro Saito, Chofu (JP); Hirofumi Totsuka, Fujisawa (JP); Manabu Nakanishi, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 492 days.

(21) Appl. No.: 12/474,805

(22) Filed: May 29, 2009

(65) Prior Publication Data

US 2009/0322922 A1 Dec. 31, 2009

(30) Foreign Application Priority Data

Jun. 30, 2008 (JP) ................................. 2008-171731

(51) Int. Cl.
*H04N 5/217* (2011.01)

(52) U.S. Cl.
USPC ............................. 348/300; 348/241; 348/308

(58) Field of Classification Search
USPC .................. 348/241, 243, 245, 294, 300, 308; 250/208.1
See application file for complete search history.

(56) References Cited

U.S. PATENT DOCUMENTS

| | | | |
|---|---|---|---|
| 5,610,546 A | 3/1997 | Carbou et al. | |
| 6,222,175 B1 * | 4/2001 | Krymski | 250/208.1 |
| 6,873,364 B1 * | 3/2005 | Krymski | 348/308 |
| 7,109,775 B2 | 9/2006 | Tomita | |
| 7,279,668 B2 * | 10/2007 | Misek | 250/208.1 |
| 7,352,223 B2 | 4/2008 | Tomita | |
| 7,528,878 B2 | 5/2009 | Sato et al. | 348/317 |
| 2002/0054390 A1 * | 5/2002 | Koizumi et al. | 358/513 |
| 2003/0071195 A1 | 4/2003 | Misek | 250/208.2 |
| 2007/0279503 A1 | 12/2007 | Totsuka | 348/283 |
| 2009/0141157 A1 | 6/2009 | Kobayashi et al. | 348/308 |

FOREIGN PATENT DOCUMENTS

| | | |
|---|---|---|
| JP | 06-232708 A | 8/1994 |
| JP | 2000-346950 A | 12/2000 |
| JP | 2003-228457 A | 8/2003 |
| WO | 2004/102805 A1 | 11/2004 |
| WO | 2009/017920 A1 | 2/2009 |

* cited by examiner

*Primary Examiner* — Zachary Wilkes
(74) *Attorney, Agent, or Firm* — Fitzpatrick, Cella, Harper & Scinto

(57) ABSTRACT

In order to suppress a variation of a signal held by each signal holding unit, a solid-state imaging apparatus of the present invention is characterized in that, when a clamp operation of a pixel output signal is performed in the signal holding unit, a time changing rate of an amplitude of a drive pulse supplied to the selecting unit for turning from a non-conducting state to a conducting state is not larger than a time changing rate of the amplitude of the drive pulse supplied to the selecting unit for turning from the conducting state to the non-conducting state.

8 Claims, 7 Drawing Sheets

SOLID-STATE IMAGING APPARATUS

BACKGROUND OF THE INVENTION

1. Field of the Invention

The present invention relates to a solid-state imaging apparatus.

2. Description of the Related Art

In recent years, MOS type solid-state imaging apparatuses have come into widespread use for digital cameras and scanners. One of the reasons is that realization of a high S/N (signal to noise ratio) has been enabled. It is useful as one means for realizing a high S/N to provide a read circuit for each pixel column of a pixel matrix array with an output unit to a post-stage circuit such as an amplifier. By amplifying a signal with the amplifier for each pixel column, the amplification factor of the post-stage circuit can be suppressed to be low. Therefore, with amplification of a signal, the noise which occurs at the post-stage is not amplified greatly. As a result, the S/N can be enhanced.

In Japanese Patent Application Laid-Open No. 2003-228457 (hereinafter, Patent Document 1), the number of circuit elements is reduced and chip area is reduced by sharing the amplifier which is provided for each pixel column by a plurality of columns. In the aforementioned example, one amplifying circuit is shared by pixels of two columns.

The circuit operation is as follows. First, a plurality of sampling switches sharing the amplifier is brought into an ON state, and the reset signal from a pixel is clamped by a clamp capacitor (signal holding unit) with a reference voltage VREF of a differential amplifier as a reference. Next, the sampling switches of a plurality of pixel columns are simultaneously brought into an OFF state. Next, by bringing the sampling switch into an ON state for each pixel column, optical signals from the pixels are read out, and differential signals between the optical signals and reset signals are outputted from the amplifier.

However, when a transistor, which is a sampling switch, is brought into an OFF state in the above described operation, the potentials of the nodes at both ends of the sampling switch vary due to charge injection and clock field through. The potential variation of the node is sometimes superimposed on a signal as an offset component when the signal is held in the signal holding unit.

The waveform of the drive pulse which controls each sampling switch differs depending on the difference in wiring resistance due to asymmetry of the layout of the control wiring and a parasitic capacitor. In the transistor which is the sampling switch, the parasitic capacitor and the threshold value between the respective electrode regions vary. The extent of the potential variation due to charge injection and field through changes according to the waveform of the drive pulse of the transistor and the parasitic capacitor of the transistor. Variation of the potential of the node due to charge injection and field through differs depending on the timing at the time of turning the transistor to an OFF state and the pulse waveform.

When the output nodes of a plurality of transistors are commonly connected to the post-stage circuit, and timing of shifting to the OFF state differs among the transistors, or the pulse waveforms at the time of shifting to the OFF state differ, the charge distribution by charge injection and field through differs in the respective transistors. When the aforementioned charge distribution differs among the transistors, the aforementioned offset component differs at each signal holding unit. Variation of the offset component becomes a fixed pattern noise, and significantly degrades image quality. Further, variation of the offset component for a signal has a greater influence as the capacitance value of the signal holding unit is smaller.

As described above, the present inventors have found that a plurality of sampling switches provided to share the output unit such as an amplifier by signal holding units of a predetermined number cause the new problem that the offset component superimposed on the signal held by the signal holding unit varies.

The present invention is made in view of such a problem, and has an object to obtain a high image quality in a solid-state imaging apparatus in which, for example, an output unit is shared by signal holding units of a predetermined number.

SUMMARY OF THE INVENTION

In view of the above described problem, the present invention provides a solid-state imaging apparatus having a plurality of signal holding units each having an input node to which a signal is supplied from an output node of a pixel, a plurality of common output units each having an input node to which signals from output nodes of the signal holding units of a predetermined number are supplied, and a selecting unit, each arranged correspondingly to each of the signal holding units, to transfer the signal from the output node of the signal holding unit to the input node of the common output unit, characterized in that the solid-state imaging apparatus further includes a feedback path for connecting the output node of the common output unit to the input node of the common output unit, and at a state of supplying the signal from the output node of the common output unit to the input node of the common output unit through the feedback path, the selecting unit is turned to a conducting state so that the signal holding unit clamps the signal outputted from the pixel, and the clamp operation is performed, such that a time changing rate of an amplitude of a drive pulse supplied to the selecting unit for turning from a non-conducting state to the conducting state is not larger than a time changing rate of the amplitude of the drive pulse supplied to the selecting unit for turning from the conducting state to the non-conducting state.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENTS

Hereinafter, embodiments of the invention will be described by using the drawings.

(Embodiment 1)

FIGS. 1 to 5 are respectively a block diagram of a pixel array with M rows and N columns configuring a first embodiment, an equivalent circuit diagram of one pixel, a detailed diagram of a common output unit, a detailed diagram of an output buffer stage of a driving unit and a drive timing chart.

Figure 1:
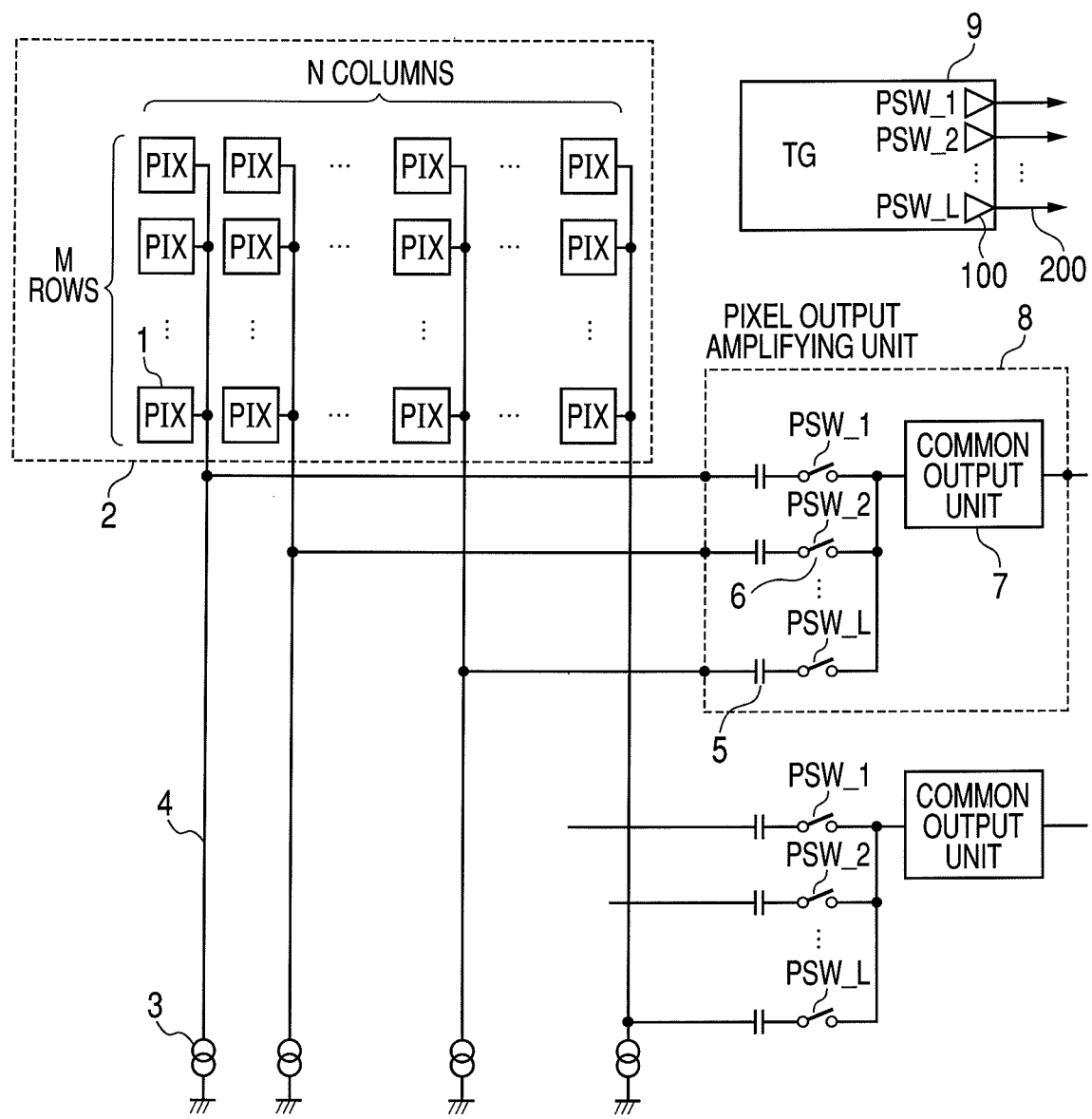
FIG. 1 is a block diagram for describing a solid-state imaging apparatus of embodiment 1.

In FIG. 1, a pixel 1, a pixel array 2 in which pixels are arranged in a matrix with M rows and N columns, a constant current source 3 provided at each pixel column, and a common output line 4 for each pixel column are illustrated. It can be said that the constant current source 3 is provided at each of the common output lines 4.

A signal holding unit 5 holds a signal which transmits through the common output line. The signal from an output node of a pixel is supplied to an input node of the signal holding unit.

A selecting unit 6 selects and outputs the signal held in each of the signal holding units to a common output unit which will be described later. The selecting unit 6 is provided correspondingly to each of the signal holding units, and transfers a signal to an input node of the common output unit from an output node of the signal holding unit.

A common output unit 7 is provided at signal holding units of a predetermined number. The common output unit 7 sequentially outputs signals of the signal holding units of a predetermined number to a post-stage. The common output unit performs impedance conversion between the signal holding unit and the post-stage circuit, or amplification of a signal when transmitting the signal to the post-stage circuit from the signal holding unit.

An amplifying unit 8 includes the signal holding unit 5 to the common output unit 7. The solid-state imaging apparatus of the present embodiment has a configuration having a plurality of amplifying units 8.

A driving unit 9 supplies a drive pulse for controlling drive of the selecting unit. An output stage 100 amplifies and outputs a control signal which is an origin of the drive pulse. A control signal line 200 is also provided. Each amplifying unit 8 is provided at pixel columns of a predetermined number (L columns in this case), and (N/L) amplifying units 8 are provided in total. Each of the amplifying units 8 includes L of signal holding units 5, L of selecting units 6 and one common output unit 7.

Figure 2:
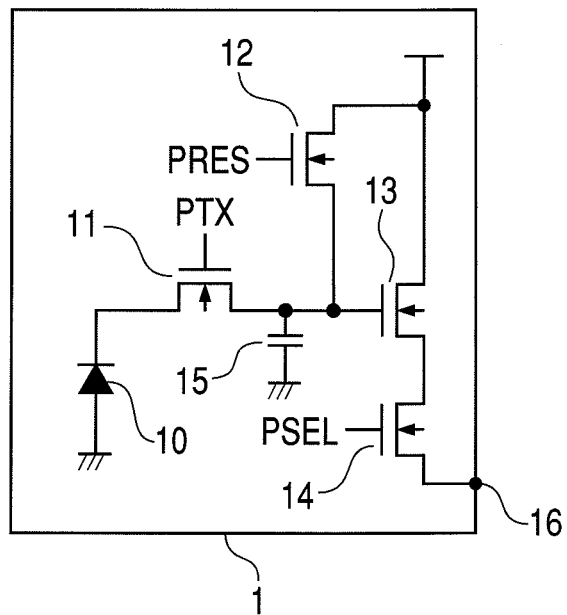
FIG. 2 is an equivalent circuit diagram of one pixel of the solid-state imaging apparatus of embodiment 1.

FIG. 2 is an equivalent circuit diagram of the pixel 1. A photodiode 10 functions as a photoelectric conversion element. A transferring unit 11 transfers a signal charge which is generated by the photoelectric conversion element 10. For example, an MOS transistor can be used. A signal charge of the photoelectric conversion element is transferred to a floating diffusion (hereinafter, FD) region 15 via the transferring unit 11. The FD region is electrically connected to an input node of a pixel amplifying part which will be described later. A reset unit 12 supplies a reference voltage to the FD region to reset the potential of the FD region. For example, an MOS transistor can be used. An amplifying transistor 13 configures the pixel amplifying part. The amplifying transistor 13 configures a source follower circuit with the constant current source 3 of FIG. 1. The input node of the pixel amplifying part is a gate of the amplifying transistor, and the gate and the FD region are electrically connected.

A pixel selecting unit 14 selects a signal of a predetermined pixel column and outputs the signal to the common output line 4. For example, an MOS transistor can be used. An output node 16 of the pixel is also illustrated. Here, signals which control the transferring unit 11, the reset unit 12 and the pixel selecting unit 14 are set as PTX, PRES and PSEL, respectively.

Figure 3:
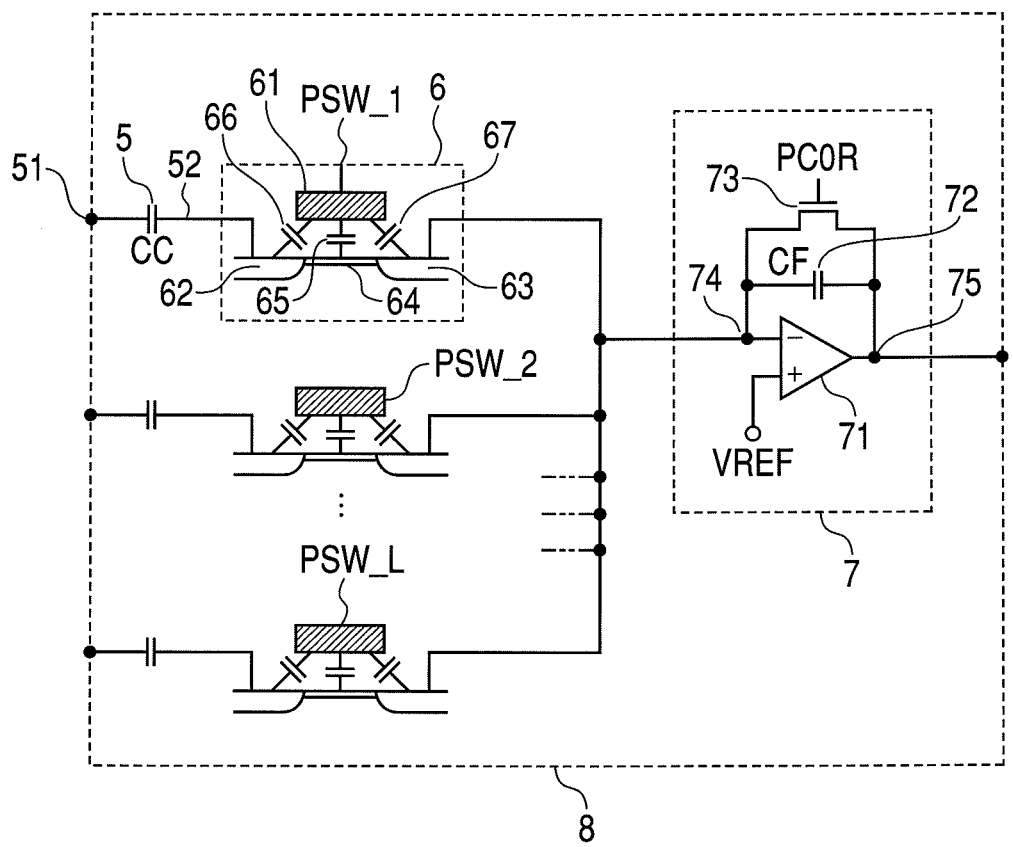
FIG. 3 is a diagram for describing an amplifying unit of embodiment 1.

FIG. 3 illustrates the amplifying unit 8 of FIG. 1 in detail. An MOS transistor is used as the selecting unit 6. Further, the common output unit 7 includes a differential amplifier 71, and a feedback capacitor 72 arranged in an electric path between one input node (inversion input terminal) and an output node of the differential amplifier. Further, the common output unit 7 includes a feedback switch 73 arranged parallel with the feedback capacitor. The feedback switch 73 is arranged in a feedback path which connects an input and output nodes of the differential amplifying unit. An input node 74 and an output node 75 of the differential amplifier are illustrated. The input and output nodes of the differential amplifier function as the input and output nodes of the common output unit.

Further, the input node and the output node of the differential amplifying unit function as the input and output nodes of the common output unit. For example, an MOS transistor can be used as a feedback switch. A reference level (VREF) is supplied to the other input node (non-inversion input terminal) of the differential amplifier.

The common output unit configures a switched capacitor amplifier by these components. For selecting unit 6, a section of an MOS transistor is illustrated for describing a charge injection phenomenon.

Drive pulses which control L of the selecting units 6 are set as PSW_1, PSW_2 . . . and PSW_L. These drive pulses are supplied from the driving unit 9 through the control signal line 200. A signal which controls the feedback switch 73 is set as PC0R. Hereinafter, the state in which the switch is in a conducting state by opening operation out of opening and closing operations of the switch will be described as an ON operation, whereas the state in which the switch is brought into a non-conducting state by the closing operation will be described as an OFF operation.

The switched capacitor amplifier of the common output unit 7 is in a one-time amplification factor mode when the PC0R is in an ON state, and outputs VREF input in a normal rotation input terminal. When the PC0R is in an OFF state, the switched capacitor amplifier is in an amplification mode of which amplification factor is defined by a capacitance ratio of the signal holding unit 5 and the feedback capacitor 72. The signal holding unit functions as an input capacitor, and the amplification factor in the amplifying mode becomes CC/CF when the capacitance value of the signal holding unit 5 is set as CC, and the capacitance value of the feedback capacitor 72 is set as CF. The amplifying unit including the switch and the capacitor amplifier is configured to be operable by switching these operation modes.

In the MOS transistor configuring the selecting unit 6, an input node 51 of the signal holding unit, and an output node 52 of the signal holding unit are included. A gate 61 and a source and drain regions 62 and 63 are also included. A channel region 64 is formed under the gate 61 via a gate insulating film when the selecting unit 6 is ON. In the present embodiment, an N type MOS transistor will be described as an example. A gate capacitor 65 is formed between the gate 61 and the channel 64. Overlap capacitors 66 and 67 which are formed between the gate 61, and the source 62 and the drain 63 are schematically illustrated.

Figure 4:
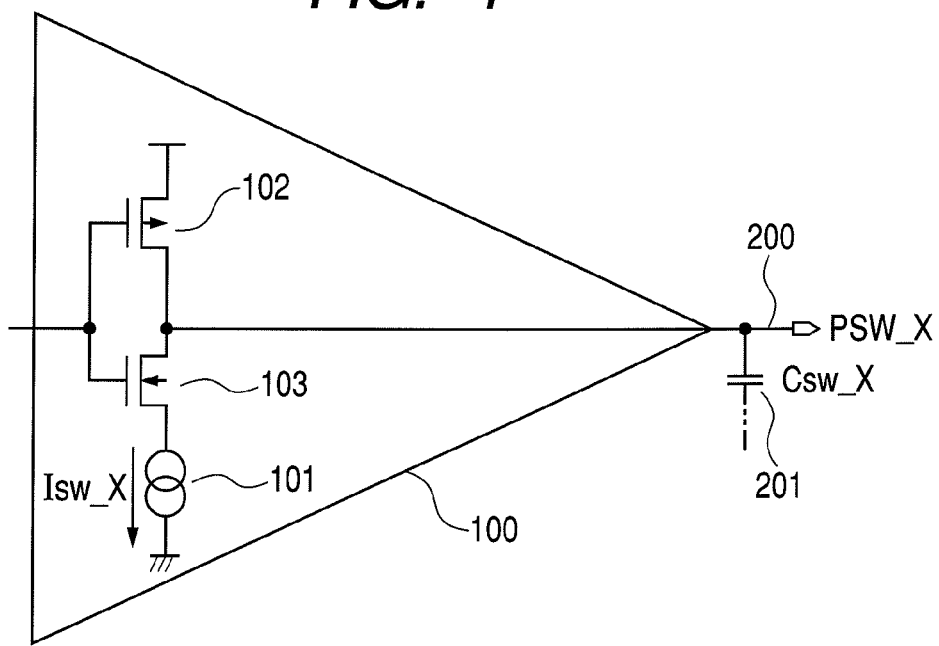
FIG. 4 is a diagram for describing an output stage of a driving unit of embodiment 1.

FIG. 4 illustrates an output buffer stage 100 of the driving unit 9 of FIG. 1 in detail. The output buffer stage 100 has a P type MOS transistor 102 and an N type MOS transistor 103 having gates to which a control signal is supplied. Drains of the P type MOS transistor 102 and the N type MOS transistor 103 are connected to each other. A power source voltage is supplied to the source of the P type MOS transistor, and the source of the N type MOS transistor is grounded via the constant current source 101. A capacitor 201 which is added to the control signal line 200 is schematically illustrated.

Here, attention is focused on the X-th drive pulse PSW_X (X is an integer from 1 to L). A capacitor added to the X-th control signal line 200 is set as Csw_X, and a current passing in the constant current source 101 of the output buffer stage of the X-th driving unit is set as Isw_X. A time Tfsw_X in which the PSW_X shifts from an ON state to an OFF state is inversely proportional to Isw_X, and proportional to the Csw_X. Accordingly, by changing them, the shifting time can be controlled. Here, when the time in which the PSW_X shifts from the ON state to the OFF state indicates the time in which VDD (maximum value of the pulse waveform) changes to 10% from 90% when the waveform is observed at the output node of the driving unit.

Here, in order to make the time changing rate of the amplitude of the drive pulse lower during the time of shifting from the OFF state to the ON state than during the time of shifting from the ON state to the OFF state, the circuit is configured to supply a power source voltage directly to the source of the P type MOS transistor as shown in FIG. 4. Alternatively, a constant current source with a larger drive force than the constant current source 101 is provided between the power source and the source of the P type MOS transistor.

Figure 5:
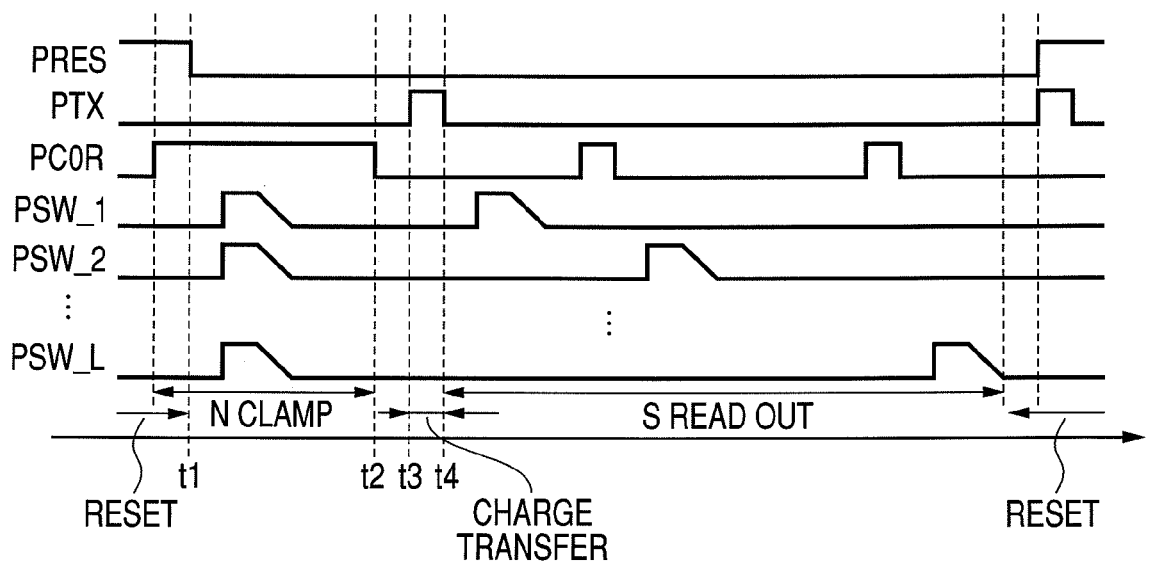
FIG. 5 is a drive pulse diagram of the solid-state imaging apparatus of embodiment 1.

Next, the drive timing chart of FIG. 5 will be described. In the present embodiment, the pixel array with M columns and N rows is configured. However, in order to describe the operation of one row, the MOS transistor 14 which is the pixel selecting unit is assumed to be in an ON state. Each of the switches is High active (ON state in an ON state).

First, at a time t1, a reset signal PRES shifts from an OFF state to an ON state. By this operation, the potential of the FD region is reset at a reference potential, and thereafter, as floating, a signal based on the reference potential is outputted to the common output line 4 via the source follower circuit. At this time, the drive pulse of an ON state is supplied to the feedback switch 73 of the switched capacitor amplifier, and the normal rotation input level VREF is outputted to the output node of the differential amplifier 71 in one time amplification factor mode.

In t1 to t2, pulses which shift to an ON state from the OFF state are supplied for the drive pulses PSW_1 to PSW_L. Next, the pulse waveforms which shift to an OFF state from the ON state are supplied. Thereby, the terminal (input node) which is connected to the pixel output node of the signal holding capacitor 5 is at a reset level based on the potential of the FD region, and the terminal (output node) at the side opposite from the input node is at the VREF level. By this operation, the reset level of the pixel output signal is clamped at the VREF level. For the drive pulses PSW_1, PSW_2 to PSW_L which are respectively supplied to L of selecting units 6, the drive pulses in the same pulse waveforms can be supplied.

When the control signal PSW shifts to an OFF state from the ON state here, the electric charge held by the overlap capacitor 66 works as a clock field through charge. In addition, about a half of the electric charges generating in the channel 64 under the gate work as charge injection charges. Thereby, the potential of the node connected to the output node of the signal holding capacitor 5 of the selecting unit 6 varies. As a result, an offset voltage occurs to the signal holding capacitor 5. Similarly, at the node opposite to the signal holding capacitor 5 of the selecting unit 6, clock field through charges and charge injection charges occur.

The charge amount which causes offset written to the signal holding capacitor 5 is determined by the size of the selecting unit 6. For example, when a maximum charge amount of the clock field through and charge injection which generate in the selecting unit 6 is set as Qsw_max, a maximum offset voltage Voff_max which is written into the signal holding capacitor 5 is what is obtained by dividing Qsw_max by a capacitance value CC of the signal holding capacitor 5. The offset amount written into the signal holding capacitor is further multiplied by CC/CF by the switched capacitor amplifier.

Here, in the process of the selecting unit 6 shifting to an OFF state from the ON state, charges are supplied from the output node of the differential amplifier 71 which has low impedance so as to cancel out Qsw_max. The charge amount can be made to differ by the control method during the period in which the selecting unit 6 shifts to an OFF state from the ON state.

In the present embodiment, as described with FIG. 4, the period in which the selecting unit 6 shifts to an OFF state from the ON state is ensured by properly designing the constant current source 101 of the output stage of the driving unit, and the capacitor added to the control signal line 200. Thereby, sufficient charges are supplied from the output node of the differential amplifier 71. As a result, the offset voltage which is written into the signal holding capacitor 5 can be reduced.

A length Toff of the period in which the selecting unit 6 shifts to the OFF state from the ON state is properly 30 ns≤Toff≤1 μs. This is because, with a length Toff of less than 30 ns, sufficient charges are not supplied from the output node of the differential amplifier 71, and the influence of the offset voltage becomes relatively large. Further, with a length Toff of more than 1 μs, the influence on the readout speed becomes large.

Meanwhile, the time in which the selecting unit 6 shifts to the ON state from the OFF state is irrelevant to the offset voltage. When the time in which the selecting unit 6 shifts to the ON state from the OFF state is made long, the circuit operation becomes slow. Therefore, pulse shift to the ON state from the OFF state is preferably performed in as short a time as possible.

From above, the time in which the selecting unit 6 shifts to the ON state from the OFF state needs to be made as short as possible, and the time in which it shifts to the OFF state from the ON state needs to be set to be long so that the offset voltage becomes sufficiently small. Specifically, as compared with the time changing rate of the amplitude of the drive pulse when the selecting unit 6 shifts to the ON state from the OFF state, the time changing rate of the amplitude of the drive pulse when the selecting unit 6 shifts to the OFF state from the ON state is made small. FIG. 5 illustrates the pulse waveform. In t1 to t2, as compared with the rise of the pulse at the ON time, the drop of the pulse at the OFF time becomes a gradual change.

The circuit configuration for achieving the time changing rate as described above can be configured with a circuit which extracts the charges of the wiring capacitor with a constant current, and the circuit using a switched capacitor, in addition to the method of using the circuit of FIG. 4.

Next, at the time t2, PC0R is shifted to an OFF state from the ON state, and the switched capacitor amplifier of the common output unit 7 is brought into an amplification mode.

Subsequently, at a time t3, a signal PTX which controls the transferring unit 11 is brought into an ON state, and brought into an OFF state at a time t4, and the charges accumulated in the photoelectric conversion element 10 are transferred to the FD region 15. Thereby, the optical signal level corresponding to the signal charge is outputted to the common output line 4 via the source follower.

Thereafter, PSW_1 to PSW_L and PC0R are alternately brought into an ON state and OFF state repeatedly, and thereby, the pixel outputs of one column of the pixel array 2 with pixels arranged in M rows and N columns are sequentially read out to the post-stage of the common output unit 7.

The example of providing each of amplifying units 8 at every L column, (N/L) amplifying units 8 in total, for the pixels arranged in M rows and N columns is described above, but the present embodiment is not limited to this. For example, the number of columns may be only one. Further, a larger number of amplifying units may be provided.

Figure 6:
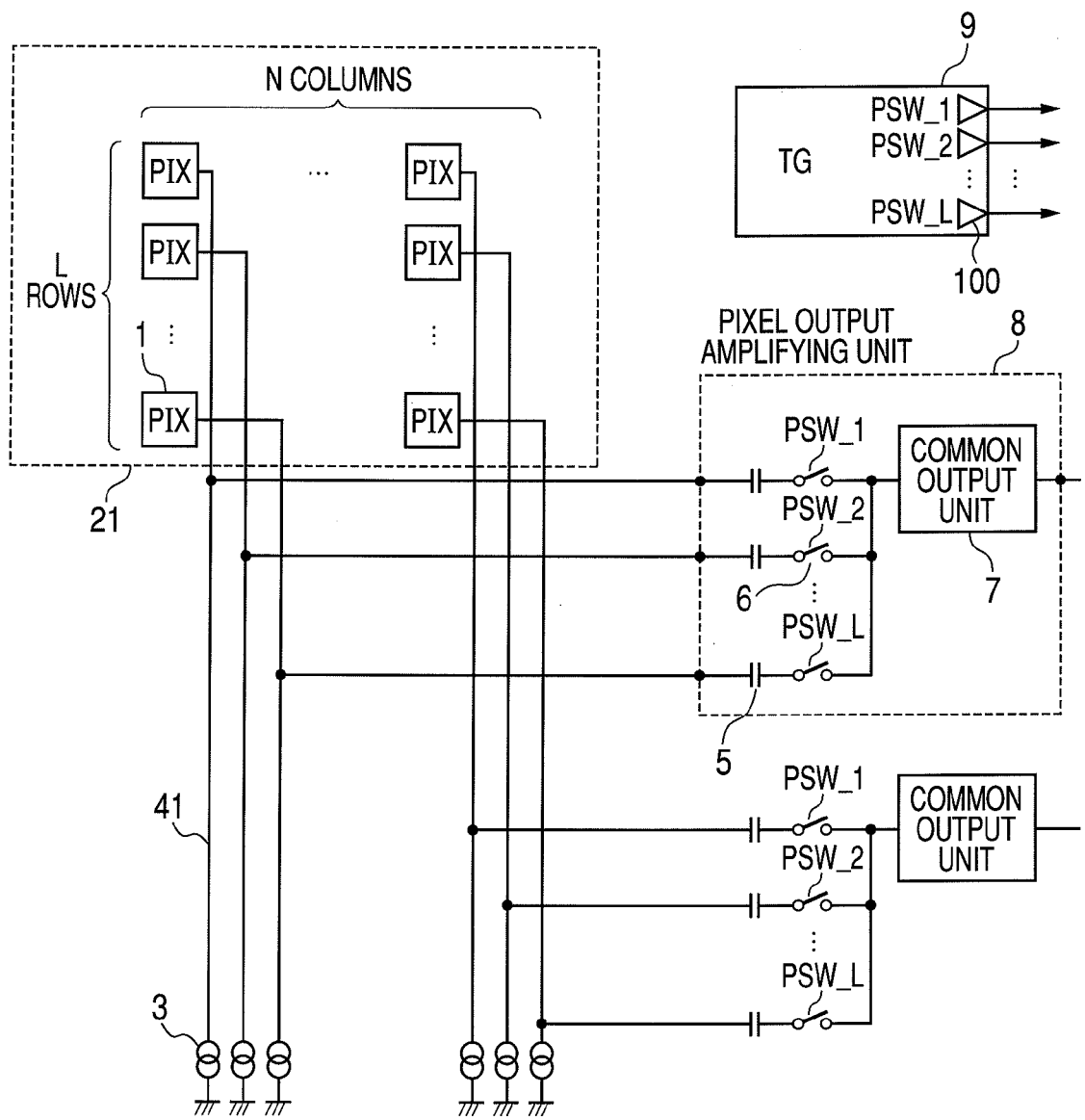
FIG. 6 is a diagram for describing a first modified example of embodiment 1.

FIG. 6 is a first modified example of FIG. 1. A pixel array 21 with pixels 1 being arranged in L columns and N rows, and a pixel output line 41 are illustrated. Unlike the pixel array 2 of FIG. 1, each pixel output line 41 is provided for each pixel, and the constant current source 3 is connected to each of the pixel output lines 41. The amplifying unit 8 is shared by a plurality of pixel columns. The present embodiment also can be applied to such a case.

Figure 10:
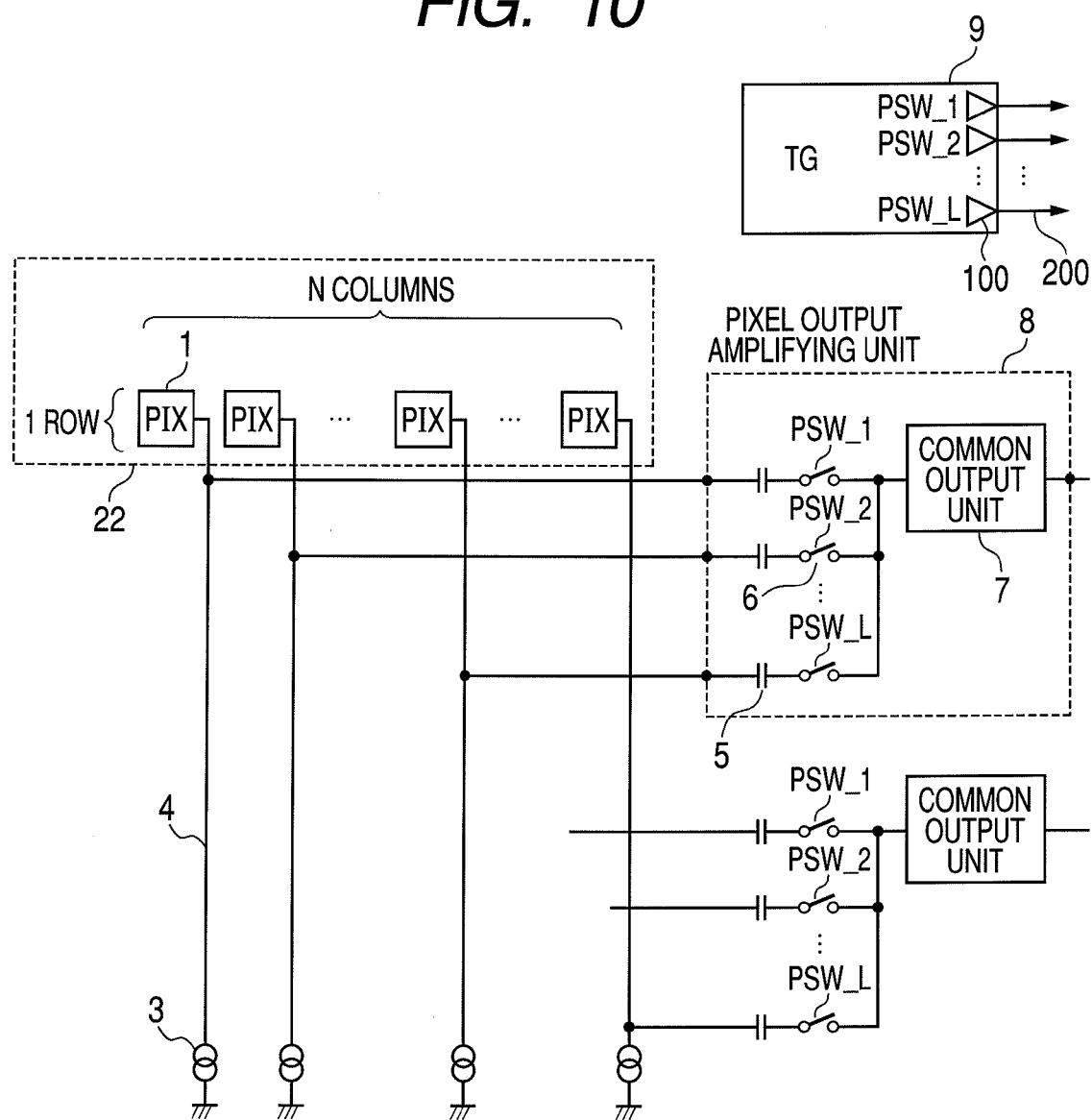
FIG. 10 is a diagram for describing a second modified example of embodiment 1.

FIG. 10 is a second modified example. The present modified example is an example applied to a one-dimensional pixel array with pixels arranged in one row and N columns. The amplifying unit 8 is shared by a plurality of pixel columns. By sharing the amplifying unit by a plurality of pixels, the chip area of the linear sensor can be made small. For the drive timing, the drive pulse waveform of FIG. 5 can be directly applied. In such a configuration, the present embodiment also can be applied.

According to the present embodiment, by reducing the offset due to electric charges by clock field through and charge injection, the solid-state imaging apparatus can be realized, which causes less fixed pattern noise even when the capacitance value of the signal holding unit 5 is made small.

(Embodiment 2)

A second embodiment will be described by using FIGS. 7 and 8.

Figure 7:
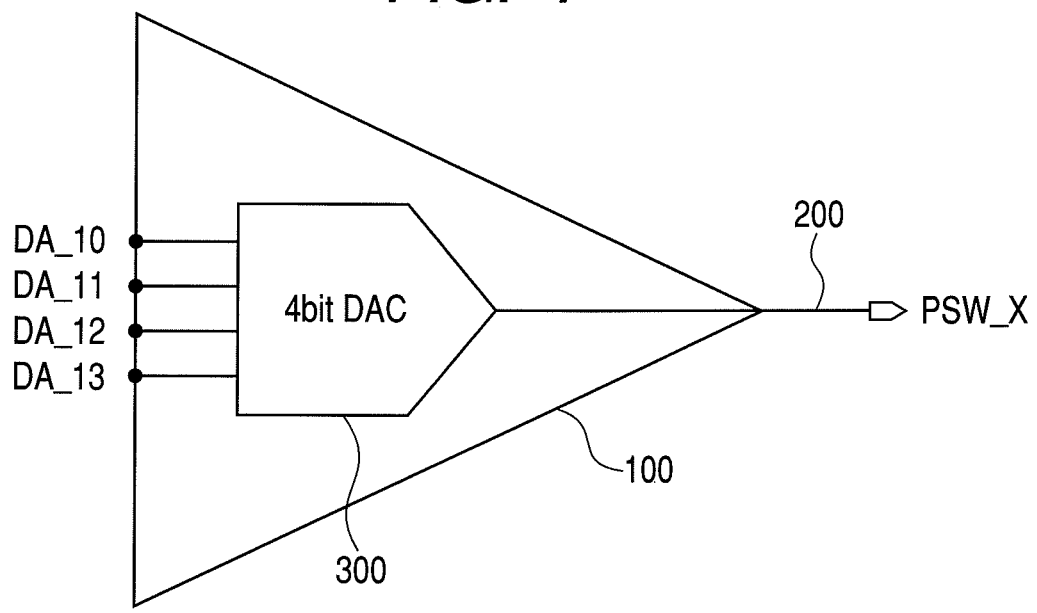
FIG. 7 is a diagram for describing an output stage of a driving unit of embodiment 2.

FIG. 7 is a circuit diagram in the case of using a digital analog converter with a drive circuit functioning as a ramp shaped wave generator circuit. FIG. 8 illustrates an input waveform and an output waveform of the circuit of FIG. 7.

Figure 8:
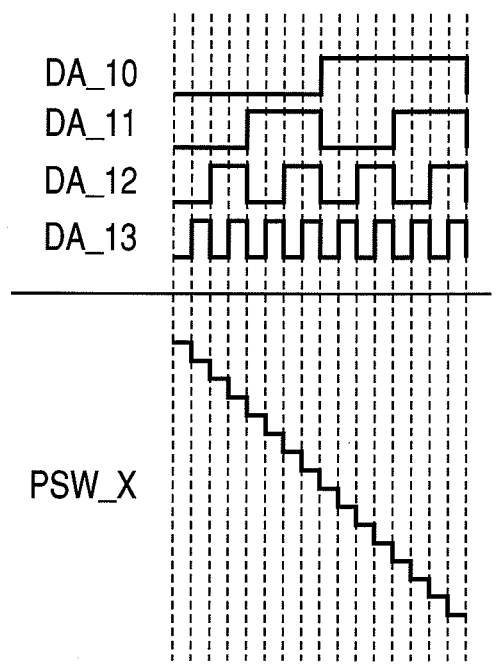
FIG. 8 is a diagram for describing a pulse waveform of the driving unit of embodiment 2.

In FIGS. 7 and 8, a Digital Analog Converter (hereinafter, DAC) 300 is illustrated, and control signals DA_I0, DA_I1, DA_I2 and DA_I3 control the DAC 300. The DAC 300 with resolution of 4 bit is illustrated as an example. A PSW_X signal is generated by the control signals DA_I0 to DA_I3 from the four input nodes. Drive pulses differing in frequency and pulse width are supplied to DA_I0 to DA_I3. As an example, by inputting the waveforms shown in FIG. 8, the waveform which ramps down by 16 steps from an ON state to an OFF state can be outputted. For the shift to the ON state from the OFF state, the aforementioned relation of the time changing rate can be realized by outputting the signals through an ordinary inverter instead of the DAC.

According to the configuration of the present embodiment, the waveform of the drive pulse can be made an optional waveform. The DAC 300 can be given sufficient driving ability to the load of the control signal wiring, and therefore, the ramp waveform can be outputted without being influenced by the capacitor added to the output.

According to the present embodiment, in addition to the effect of embodiment 1, an optional control waveform can be easily created, and the time changing rate of shift from the ON state to the OFF state can be easily set.

Embodiment (3)

A third embodiment will be described by using FIG. 9.

The present embodiment is an example of making the operation current of a constant current source changeable by monitoring the output from the drive circuit of a selecting unit, and feeding back the monitored result to the constant current source.

Figure 9:
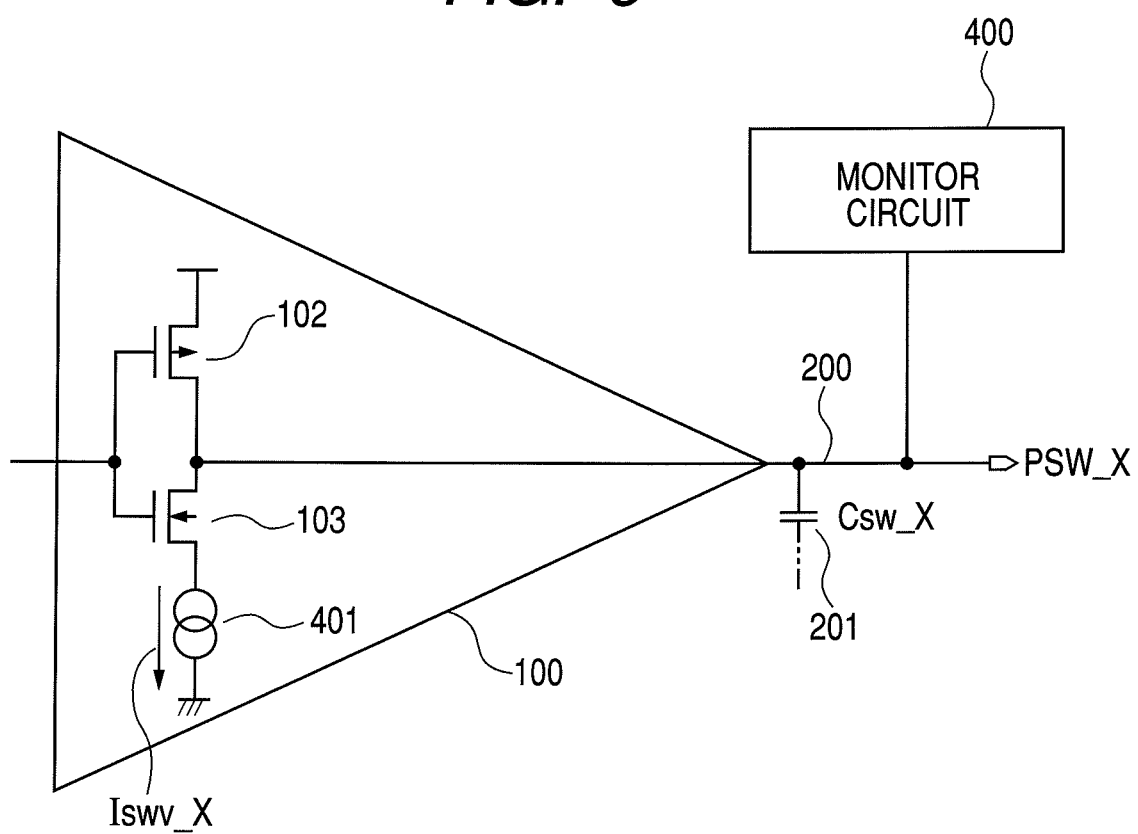
FIG. 9 is a diagram for describing an output stage of a driving unit of embodiment 3.

FIG. 9 illustrates a variable constant current source 401, and a monitor circuit 400 which monitors the potential of the control signal line 200, and regulates a current value Iswv_X of the variable constant current source 401 from the monitored result. A feedback path (not illustrated) from the monitor circuit to the variable constant current source 401 is provided.

When an N type MOS transistor is used for the selecting unit 6 as shown in FIG. 3, if the voltage inputted to the source 62 of the MOS transistor configuring the selecting unit changes by pixel output, the capacitance value of the overlap capacitor 66 also varies. When the number of pixels is large, the capacitor 201 which is added to the control signal wiring 200 varies due to variation of the overlap capacitor 66, and this may influence the signals. Here, attention is focused on an X-th control signal PSW_X (X is an integer from 1 to L). The capacitance value added to the X-th control signal line 200 is set as Csw_X, a current defined by the output stage constant current source 101 of the X-th control signal supply unit is set as Iswv_X, a time Tfsw_X in which PSW_X shifts to an OFF state from an ON state is expressed by the following expression:

$$Tfsw\_X = (VDD \times Csw\_X)/Iswv\_X \qquad (2).$$

If Iswv_X is constant, the capacitance value Csw_X which is added to the X-th control signal line 200 also varies due to influence of the overlap capacitor variation, as a result of which, Tfsw_X changes. Thus, by using the monitor circuit 400, the potential of the control signal line 200 is monitored, and the variation amount is fed back to the variable constant current source. When Iswv_X is regulated so that Tfsw_X becomes constant, the output buffer stage 100 with influence of the variation of Csw_X being suppressed can be configured.

According to the present embodiment, in addition to the effect of embodiment 1, influence of variation of Csw_X can be further suppressed, and influence on the signal can be suppressed.

The present invention is described above by citing the embodiments. However, the present invention is not limited to these embodiments. For example, in FIG. 5, all the waveforms of the pulses PS_1 to PSW_L have small changing rates from the ON state to the OFF state, but such waveforms need to be obtained at least in the pulses supplied in the period of t1 to t2. The pulses which are supplied in the period t1 to t2 are, in other words, the pulses which are supplied in the period in which the reference signals for clamp operation are supplied to the signal holding unit 5. Further, the case where the signal charge is an electron is described, but the signal charge may be a hole. In this case, change of the potential in the signal holding unit becomes opposite, and therefore, the polarities of the selecting unit and the differential amplifying unit are properly changed. Further, the pixel configuration may be such that the amplifying unit and the like are shared by a plurality of photoelectric conversion elements.

Further, in each of the embodiments, only the pulse values of the ON state to the OFF state are supplied. Other than this, the time changing rate at the time of shifting to the ON state from the OFF state may be made smaller than at the time of shifting from the ON state to the OFF state by generating the pulse at an intermediate potential, for example, and holding the pulse at the intermediate potential for a constant period.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-171731, filed Jun. 30, 2008, which is hereby incorporated by reference herein in its entirety.

What is claimed is:

1. A solid-state imaging apparatus comprising:
   a column circuit that includes:
      a plurality of signal holding units each having an input node to which a signal is supplied from an output node of a pixel,
      a plurality of common output units each having an input node to which signals from output nodes of the signal holding units of a predetermined number are supplied,
      a plurality of selecting units, each arranged in an electric path between an output node of a corresponding signal holding unit and an input node of a corresponding common output unit, to transfer a signal from the output node of the corresponding signal holding unit to the input node of the corresponding common output unit, and
      a feedback path for connecting an output node of one of the common output units to an input node of the one of the common output units,
   wherein, at a state of supplying a signal from the output node of the one of the common output units to the input node of the one of the common output units through the feedback path, a corresponding selecting unit is shifted to a conducting state so that a corresponding signal holding unit performs a clamping operation to clamp a signal outputted from a corresponding pixel, and
   wherein the clamping operation is performed such that a time changing rate of an amplitude of a drive pulse supplied to the corresponding selecting unit for shifting from a non-conducting state to the conducting state is greater than a time changing rate of the amplitude of the drive pulse supplied to the corresponding selecting unit for shifting from the conducting state to the non-conducting state;
   a driving unit for supplying the drive pulse to the selecting units,
      wherein the driving unit includes an output buffer stage for amplifying and outputting a control signal on which generation of the drive pulse is based, and
      wherein the output buffer stage includes a P type MOS transistor and an N type MOS transistor having gates to which the control signal is supplied, drains of the P type MOS transistor and the N type MOS transistor are mutually connected, a power source voltage is supplied to a source of the P type MOS transistor, and a source of the N type MOS transistor is grounded through a constant current source; and
   a monitoring unit for monitoring the time changing rate of the amplitude of the drive pulse, wherein the monitoring unit feeds back a monitoring result to the constant current source to adjust a current value of the constant current source so as to maintain constant the time changing rate of the amplitude of the drive pulse.

2. The solid-state imaging apparatus according to claim 1, wherein each of the common output units includes an amplifying unit, and the amplifying unit operates switchably between a mode of outputting a reference level for performing the clamp operation, and an amplifying mode of which an amplification factor is defined by a ratio of a capacitance value of a corresponding signal holding unit used as an input capacitor to a capacitance value of a feedback capacitor arranged in an electric path in parallel to the feedback path.

3. The solid-state imaging apparatus according to claim 1, wherein the pixels are arranged in a matrix to form a pixel array, and each of the common output units corresponds commonly to the pixels arranged along a column or a row of the pixels.

4. The solid-state imaging apparatus according to claim 1, wherein the driving unit includes, at an output stage thereof, a ramp shaped wave generator circuit for generating a ramp shaped wave from an inputted control signal, the time changing rate of the amplitude of the drive pulse supplied to the selecting units for shifting from the conducting state to the non-conducting state being controlled based on the ramp shaped wave.

5. The solid-state imaging apparatus according to claim 1, wherein a duration Toff of a period of shifting from the conducting state to the non-conducting state of the drive pulse is 30 ns≤Toff≤1 µs.

6. A solid-state imaging apparatus comprising:
   a driving unit for supplying a drive pulse to a selecting unit;
   a column circuit that includes:
      a plurality of signal holding units each having an input node to which a signal is supplied from an output node of a pixel,
      a plurality of common output units each having an input node to which signals from output nodes of the signal holding units of a predetermined number are supplied,
      a plurality of selecting units, each arranged in an electric path between an output node of a corresponding signal holding unit and an input node of a corresponding common output unit, to transfer a signal from the output node of the corresponding signal holding unit to the input node of the corresponding common output unit, and
      a feedback path for connecting an output node of one of the common output units to an input node of the one of the common output units,
   wherein, at a state of supplying a signal from the output node of the one of the common output units to the input node of the one of the common output units through the feedback path, a corresponding selecting unit is shifting to a conducting state so that a corresponding signal holding unit performs a clamping operation to clamp a signal outputted from a corresponding pixel,
   wherein the clamping operation is performed such that a time changing rate of an amplitude of the drive pulse supplied to the corresponding selecting unit for shifting from a non-conducting state to the conducting state is greater than a time changing rate of the amplitude of the drive pulse supplied to the corresponding selecting unit for shifting from the conducting state to the non-conducting state,
   wherein each of the common output units includes an amplifying unit, wherein each of the amplifying units operates switchably between a mode of outputting a reference level for performing the clamp operation, and an amplifying mode of which an amplification factor is defined by a ratio of a capacitance value of a corresponding signal holding unit used as an input capacitor to a capacitance value of a feedback capacitor arranged in an electric path in parallel to the feedback path, wherein the driving unit includes an output buffer stage for amplifying and outputting a control signal on which generation of the drive pulse is based, and wherein the output buffer stage includes a P type MOS transistor and an N type MOS transistor having gates to which the control signal is supplied, drains of the P type MOS transistor and the N type MOS transistor are mutually connected, a power source voltage is supplied to a source of the P type MOS transistor, and a source of the N type MOS transistor is grounded through a constant current source; and a monitoring unit for monitoring the time changing rate of the amplitude of the drive pulse, wherein the monitoring unit feeds back a monitoring result to the constant current source to adjust a current value of the constant current source so as to maintain constant the time changing rate of the amplitude of the drive pulse.

7. A driving method of a solid-state imaging apparatus having a column circuit that includes a plurality of signal holding units each having an input node to which a signal is supplied from an output node of a pixel, a plurality of common output units each having an input node to which signals from output nodes of the signal holding units of a predetermined number are supplied, a plurality of selecting units, each arranged in an electric path between an output node of a corresponding signal holding unit and an input node of a corresponding common output unit, to transfer a signal from the output node of the corresponding signal holding unit to the input node of the corresponding common output unit, and a feedback path for connecting an output node of one of the common output units to an input node of the one of the common output units, the driving method comprising steps of:

shifting, at a state of supplying a signal from the output node of the one of the common output units to the input node of the one of the common output units through the feedback path, a corresponding selecting unit to a conducting state so that a corresponding signal holding unit performs a clamping operation to clamp a signal outputted from a corresponding pixel;

controlling the clamping operation such that a time changing rate of an amplitude of a drive pulse supplied to the corresponding selecting unit for shifting from a non-conducting state to the conducting state is greater than a time changing rate of the amplitude of the drive pulse supplied to the corresponding selecting unit for shifting from the conducting state to the non-conducting state;

amplifying and outputting a control signal on which generation of the drive pulse is based, wherein the outputting utilizes an output buffer stage that includes a P type MOS transistor and an N type MOS transistor having gates to which the control signal is supplied, drains of the P type MOS transistor and the N type MOS transistor are mutually connected, a power source voltage is supplied to a source of the P type MOS transistor and a source of the N type MOS transistor is grounded through a constant current source; and monitoring the time changing rate of the amplitude of the drive pulse such that a monitoring result is fed back to the constant current source to adjust a current value of the constant current source so as to maintain constant the time changing rate of the amplitude of the drive pulse.

8. A driving method of a solid-state imaging apparatus having a column circuit that includes a plurality of signal holding units each having an input node to which a signal is supplied from an output node of a pixel, a plurality of common output units each having an input node to which signals from output nodes of the signal holding units of a predetermined number are supplied, a plurality of selecting units, each arranged in an electric path between an output node of a corresponding signal holding unit and an input node of a corresponding common output unit, to transfer a signal from the output node of the corresponding signal holding unit to the input node of the corresponding common output unit, the driving method comprising steps of:

feeding back a signal from an output node of one of the common output units to an input node of the one of the common output units; and, during the feeding back step, shifting a corresponding selecting unit between a conducting state so that a corresponding signal holding unit performs a clamping operation to a clamp a signal outputted from a corresponding pixel and a non-conducting state so that the corresponding signal holding unit receives the signal outputted from the corresponding pixel, wherein a time changing rate of an amplitude of a drive pulse supplied to the corresponding selecting unit for shifting from the non-conducting state to the conducting state is greater than a time changing rate of the amplitude of the drive pulse supplied to the corresponding selecting unit for shifting from the conducting state to the non-conducting state;

amplifying and outputting a control signal on which generation of the drive pulse is based, wherein the outputting utilizes an output buffer stage that includes a P type MOS transistor and an N type MOS transistor having gates to which the control signal is supplied, drains of the P type MOS transistor and the N type MOS transistor are mutually connected, a power source voltage is supplied to a source of the P type MOS transistor and a source of the N type MOS transistor is grounded through a constant current source; and monitoring the time changing rate of the amplitude of the drive pulse such that a monitoring result is fed back to the constant current source to adjust a current value of the constant current source so as to maintain constant the time changing rate of the amplitude of the drive pulse.

* * * * *